(12) United States Patent
Yamada et al.

(10) Patent No.: US 8,901,560 B2
(45) Date of Patent: Dec. 2, 2014

(54) DISPLAY DEVICE AND MANUFACTURING METHOD THEREFOR

(75) Inventors: Shigeyuki Yamada, Osaka (JP); Daisuke Fuse, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 261 days.

(21) Appl. No.: 13/054,922

(22) PCT Filed: Jun. 8, 2009

(86) PCT No.: PCT/JP2009/002578
§ 371 (c)(1),
(2), (4) Date: Jan. 19, 2011

(87) PCT Pub. No.: WO2010/016179
PCT Pub. Date: Feb. 11, 2010

(65) Prior Publication Data
US 2011/0127535 A1    Jun. 2, 2011

(30) Foreign Application Priority Data
Aug. 6, 2008    (JP) .................................. 2008-203189

(51) Int. Cl.
| | | |
|---|---|---|
| H01L 29/10 | (2006.01) | |
| H01L 27/32 | (2006.01) | |
| G02F 1/1345 | (2006.01) | |
| G02F 1/1362 | (2006.01) | |
| H01L 27/12 | (2006.01) | |

(52) U.S. Cl.
CPC ........ *H01L 27/3258* (2013.01); *G02F 1/13458* (2013.01); *G02F 1/136259* (2013.01); *H01L 27/1214* (2013.01); *H01L 27/3276* (2013.01)
USPC .................................... 257/59; 257/E33.005

(58) Field of Classification Search
CPC .......... G02F 1/13458; G02F 1/136259; H01L 27/3258; H01L 27/3276; H01L 27/1214
USPC .............................. 257/59, E33.005, E33.059
See application file for complete search history.

(56) References Cited

U.S. PATENT DOCUMENTS

| | | | |
|---|---|---|---|
| 2004/0008167 A1* | 1/2004 | Shigeno .......................... | 345/76 |
| 2007/0111391 A1* | 5/2007 | Aoki et al. .................... | 438/118 |
| 2007/0161236 A1* | 7/2007 | Ohtani et al. ................. | 438/672 |

FOREIGN PATENT DOCUMENTS

| | | |
|---|---|---|
| JP | H11-024094 A | 1/1999 |
| JP | H11-024101 A | 1/1999 |

(Continued)

OTHER PUBLICATIONS

Applicants bring the attention of the Examiner to the following pending U.S. Appl. No. 13/054,790, filed Jan. 18, 2011, which is a national stage of PCT application No. PCT/JP2009/002579 published as WO2010/026679, and U.S. Appl. No. 13/054,924, filed Jan. 19, 2011, which is a national stage of PCT application No. PCT/JP2009/002577 published as WO2010/016178.

(Continued)

*Primary Examiner* — Vongsavanh Sengdara
(74) *Attorney, Agent, or Firm* — Chen Yoshimura LLP

(57) ABSTRACT

An active matrix substrate of a display device of the present invention includes a glass substrate (30), a plurality of connection terminals (41) formed on the surface of the glass substrate and arranged in parallel with one another at an equal interval, and an interlayer insulating film (38) covering the plurality of connection terminals. The edge of the interlayer insulating film is so formed that tips of the plurality of connection terminals are exposed. An opening (50) is formed along the edge of the interlayer insulating film between two adjacent connection terminals. It is possible to avoid formation of pixel electrode material residue near the edge of the interlayer insulating film when a pixel electrode is formed by photo-etching through the formation of a pixel electrode material layer and a photosensitive resist layer on the interlayer insulating film.

9 Claims, 11 Drawing Sheets

(56) References Cited

FOREIGN PATENT DOCUMENTS

| JP | H11-153809 A | 6/1999 |
| JP | 2004-070308 A | 3/2004 |
| JP | 2004-205552 A | 7/2004 |

OTHER PUBLICATIONS

International Search Report (ISR) issued in PCT/JP2009/002579 (International application) mailed in Jul. 2009 for Examiner consideration, citing U.S. Appl. Publication No. 1, Foreign Patent document Nos. 1-2 listed above and JP11-024101 and JP11-153809 which have been submitted in a previous IDS.

International Search Report (ISR) issued in PCT/JP2009/002577 (International application) mailed in Jul. 2009 for Examiner consideration, citing Foreign Patent document Nos. JP11-024101, JP11-153809, and JP11-024904 which have been submitted in a previous IDS.

International Search Report (ISR) issued in PCT/JP2009/002578 (International application) mailed in Jul. 2009 for Examiner consideration, citing Foreign Patent document Nos. 1-3 listed above.

\* cited by examiner (a)

(b)

(c)

(a)

(b)

(c)

DISPLAY DEVICE AND MANUFACTURING METHOD THEREFOR

TECHNICAL FIELD

The present invention relates to a display device and a method for manufacturing the same.

BACKGROUND ART

Display devices generally have a display panel in which a switching element substrate and an opposite substrate are bonded together to hold a display medium layer in between. In this configuration, the amount of light transmission is controlled by the difference in potential between the pixel electrode formed on the switching element substrate and the common electrode formed on the opposite substrate, and an image of particular gradations is displayed on a display screen accordingly.

In recent years, as switching element substrates, active matrix substrates having switching elements arranged in a matrix for respective pixels have widely been in use. These active matrix substrates generally have multiple connection terminals, which are arranged in parallel with each other and are respectively electrically connected to the switching elements for sending drive signals to the respective switching elements. Patent Documents 1 and 2 disclose structures adjacent to the connection terminals on active matrix substrates and manufacturing methods therefor.

RELATED ART DOCUMENTS

Patent Documents

Patent Document 1: Japanese Patent Application Laid-Open Publication No. H11-24101
Patent Document 2: Japanese Patent Application Laid-Open Publication No. H11-153809

SUMMARY OF THE INVENTION

Problems to be Solved by the Invention

Manufacturing method of conventional active matrix substrates, in particular, the connection terminal area, is described below with reference to FIG. 19 and FIG. 20. FIG. 19 is a plan view of a connection terminal area of an active matrix substrate. FIGS. 20 (a) to 20 (c) are cross-sectional views of the connection terminal area of the active matrix substrate in respective manufacturing steps. FIG. 20 (c) is a cross sectional view taken along the line I-I' in FIG. 19.

In the manufacturing method of conventional active matrix substrates, first, a plurality of switching elements are arranged in a matrix over an insulating substrate 100. Then, a plurality of connection terminals 101 are formed for sending drive signals to the switching elements. The connection terminals 101 are respectively connected to the switching elements and are arranged in parallel with each other.

Next, an interlayer insulating film 102 is formed over the insulating substrate 100, on which the switching elements and the connection terminals 101 have been formed. The interlayer insulating film 102 is formed so that contact holes are formed to provide for connection to the switching elements and that tips of the connection terminals 101 are exposed.

Next, pixel electrode material 103 made of, for example, ITO (Indium Tin Oxide) is formed over the entire insulating substrate 100, on which interlayer insulating film 102 has been formed. Next, as shown in FIG. 20 (a), a photosensitive resist 104 is applied on pixel electrode material 103, followed by exposure and development. Since the edge of interlayer insulating film 102 has a steep slope having an inclination angle of approximately 70°, the thickness (R2) of photosensitive resist 104 in the vicinity of the steep slope of the interlayer insulating film 102 is larger than the thickness (R1) of photosensitive resist 104 disposed over the interlayer insulating film 102 and is larger than the thickness (R3) of photosensitive resist 104 disposed over connection terminal 101 that extends towards the edge of insulating substrate 100.

Next, photosensitive resist 104 is subjected to exposure and development. However, since photosensitive resist 104 has an excessive thickness (R2) in the vicinity of the edge of interlayer insulating film 102 as described above, photosensitive resist 104 is not removed completely, leaving residue 104' as shown in FIG. 20 (b).

Next, an etching process in which photosensitive resist 104 is used as a mask forms a pixel electrode of a predetermined pattern. Residue 104' of photosensitive resist 104, which is left behind in the corner at the edge of interlayer insulating film 102, however, prevents a complete etching of the pixel electrode, leaving pixel electrode residue 105 as shown in FIG. 20 (c).

The presence of pixel electrode residue 105 near the edge of interlayer insulating film 102 causes electrical connection between pixel electrode residue 105 and neighboring connection terminals 101, as shown in FIG. 19. This electrical connection allows a leakage current between the terminals, resulting in display errors.

One solution of these problems is an increased exposure amount to eliminate any photosensitive resist residue. However, increased exposure reduces the width of, for example, ITO lines excessively. Also, increase in the exposure amount requires extended exposure time, which decreases the manufacturing efficiency.

The present invention was devised in consideration of the issues described above, and is aimed at providing a display device that has superior visual quality and can be manufactured efficiently, and a manufacturing method thereof.

Means of Solving the Problems

A display device of the present invention includes an active matrix substrate having a plurality of switching elements arranged in a matrix and an opposite substrate located opposite to the active matrix substrate through a display medium layer, wherein the active matrix substrate includes: a plurality of connection terminals for sending drive signals to the switching elements, wherein the connection terminals are respectively connected to the switching elements and are arranged in parallel with each other; an interlayer insulating film disposed over the plurality of switching elements and over the plurality of connection terminals, wherein tips of the plurality of connection terminals along an end portion of the interlayer insulating film are exposed; and a pixel electrode disposed on the interlayer insulating film and on an exposed region of the plurality of connection terminals, the pixel electrode being electrically connected to the switching element through a contact hole formed in the interlayer insulating film. The interlayer insulating film has an opening in a region corresponding to a space between the plurality of connection terminals at an end portion thereof.

Furthermore, a display device of the present invention may have the aforementioned opening that is rectangular.

Furthermore, a display device of the present invention may have a distance of 10 µm or less from a front edge of the aforementioned opening to an edge of the aforementioned interlayer insulating film.

Furthermore, a display device of the present invention may have the aforementioned opening having a dimension of 9.5 µm to 13.5 µm or greater in the direction perpendicular to the extending direction of the plurality of connection terminals.

Furthermore, a display device of the present invention may have the aforementioned opening extending over one of the aforementioned connection terminals that the aforementioned opening adjoins.

Furthermore, a display device of the present invention may have a display medium layer made of a liquid crystal material.

Furthermore, a display device of the present invention may have a pixel electrode made of indium tin oxide or indium zinc oxide.

Furthermore, the display device of the present invention may have the aforementioned switching element being a thin film transistor.

A manufacturing method for the display device of the present invention is a manufacturing method for a display device having an active matrix substrate, which has a plurality of switching elements arranged in a matrix and an opposite substrate located opposed to the active matrix substrate through a display medium layer, the method including the steps of: preparing an insulating substrate for the active matrix substrate; arranging a plurality of switching elements in matrix on the active matrix substrate, and forming a plurality of connection terminals, which are arranged in parallel with each other and respectively electrically connected to the switching elements, for sending drive signals to the switching elements; forming an interlayer insulating material over the insulating substrate on which the switching elements and the connection terminals are disposed; forming an interlayer insulating film on a plurality of switching elements and on a plurality of connection terminals by subjecting the interlayer insulating material to exposure and development using a photomask having a plurality of openings along an edge of the photomask, which openings are arranged in parallel at a certain interval, wherein the interlayer insulating film has a contact hole leading to the switching element, exposes tips of the plurality of connection terminals along an end portion of the interlayer insulating film, and has an opening in a region corresponding to a space between the plurality of connection terminals at an end portion thereof; forming an pixel electrode material over the insulating substrate on which the interlayer insulating film has been disposed; forming a photosensitive resist on the pixel electrode material and subjecting the resist to exposure and development; and forming a pixel electrode on the interlayer insulating film and on an exposed region of the plurality of connection terminals, the pixel electrode being electrically connected to the switching element through the contact hole formed in the interlayer insulating film, by an etching process in which the photosensitive resist is used as a mask.

Effects of the Invention

The present invention provides a display device with a superior visual quality and an efficient manufacturing method of the same.

DETAILED DESCRIPTION OF EMBODIMENTS

The structures of embodiments of the present invention and the manufacturing method of the same are described in detail below with reference to the figures. In the embodiments, a liquid crystal display device is used as an example of a display device. The present invention shall not be limited to the embodiments described below.

(Structure of Liquid Crystal Display Device 10)

Figure 1:
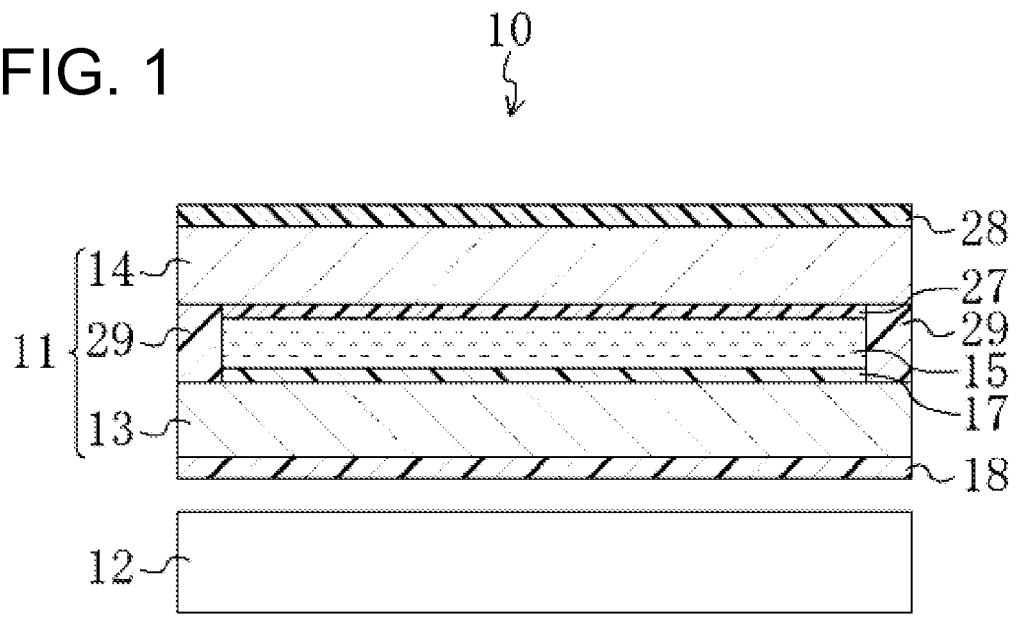
FIG. 1 is a cross-sectional view of a liquid crystal display device according to embodiments of the present invention.

FIG. 1 is a cross-sectional view of a liquid crystal display device 10 according to embodiments of the present invention. Liquid crystal display device 10 includes liquid crystal display panel 11 and backlight 12.

Liquid crystal display panel 11 includes a thin film transistor substrate 13 (active matrix substrate) in which polarizer 18 is located on the outer surface; a color filter substrate 14 (opposite substrate) in which polarizer 28 is located on the outer surface; and a liquid crystal layer 15 (display medium layer) located between the thin film transistor substrate 13 and the color filter substrate 14. Liquid crystal layer 15 is sealed in by sealing member 29 that bonds the thin film transistor substrate 13 and the color filter substrate 14 together.

On the glass substrate, which is the base material of color filter substrate 14, on the side facing liquid crystal layer 15, black matrix (light shield film, not shown), color filter (not shown), an opposite electrode (not shown), and alignment film 27 are formed.

Figure 2:
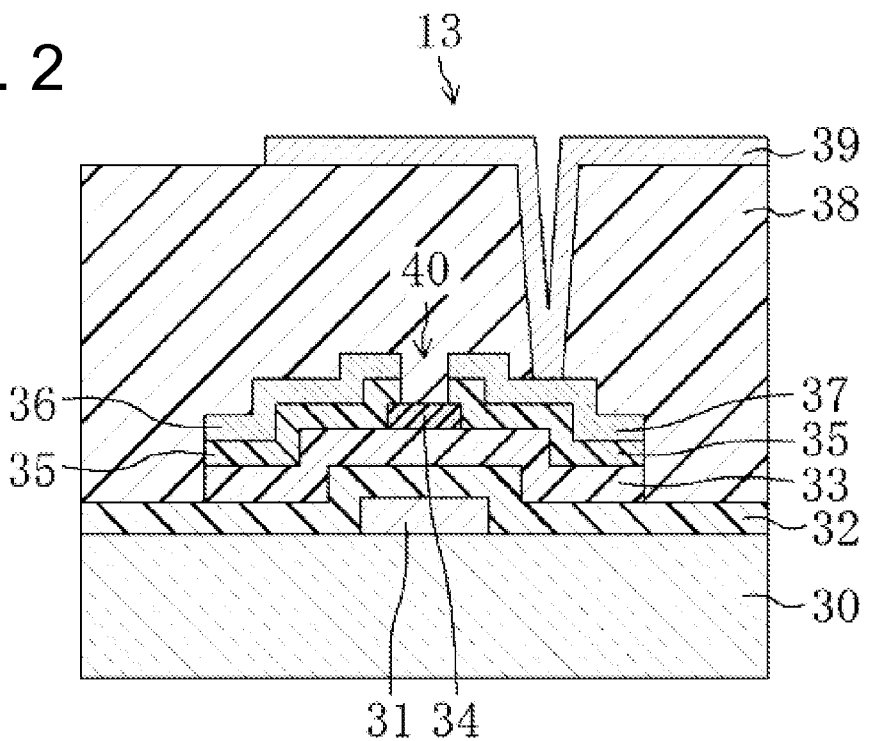
FIG. 2 is a cross-sectional view of a thin film transistor substrate according to an embodiment of the present invention.

On thin film transistor substrate 13, a plurality of gate lines (not shown), which extend in the X axis direction, and a plurality of source lines (not shown), which extend in the Y axis direction, are formed. Each rectangle region laid out by the gate lines and source lines is a pixel region. Thin film transistor (switching element) 40 is formed at each intersection of the gate lines and the source lines. FIG. 2 is a cross-sectional view of thin film transistor 40 of thin film transistor substrate 13.

Thin film transistor substrate 13 has glass substrate 30 (insulating substrate) as the base. Instead of glass substrate 30, other kinds of material such as resin may be used as the insulating substrate. On glass substrate 30, a gate electrode 31 is formed. On the gate electrode 31, a gate insulating film 32 made of $SiO_2$ or SiN, for example, is formed. In certain regions of the gate insulating film 32, semiconductor film 33 (operating semiconductor film), which is an active layer of the thin film transistor 40, is formed. Semiconductor film 33 has a channel region, on which channel protecting film 34 made of an insulating material such as $SiO_2$ or SiN is formed. On the semiconductor film 33 and channel protective film 34, an $n^+$ semiconductor film 35 is formed. Over the $n^+$ semiconductor film 35 including a portion covering channel protective film 34, source electrode 36 and drain electrode 37, both made of Al, Ta, MoW alloy or Cr, for example, are formed, wherein the source electrode 36 and the drain electrode 37 are apart from each other. Pixel electrode 39 disposed in a pixel region is electrically connected to drain electrode 37 through interlayer insulating film 38 made of an insulating material such as $SiO_2$ or SiN. Pixel electrode 39 is formed of a transparent conductive material such as ITO (Indium Tin Oxide) or IZO (Indium Zinc Oxide). On the pixel electrode 39, an alignment film 17, made of materials such as polyimide, is formed. On the edge of the thin film transistor substrate 13, connection terminals 41, which are drawn from the source line, are formed for receiving external signals.

Figure 3:
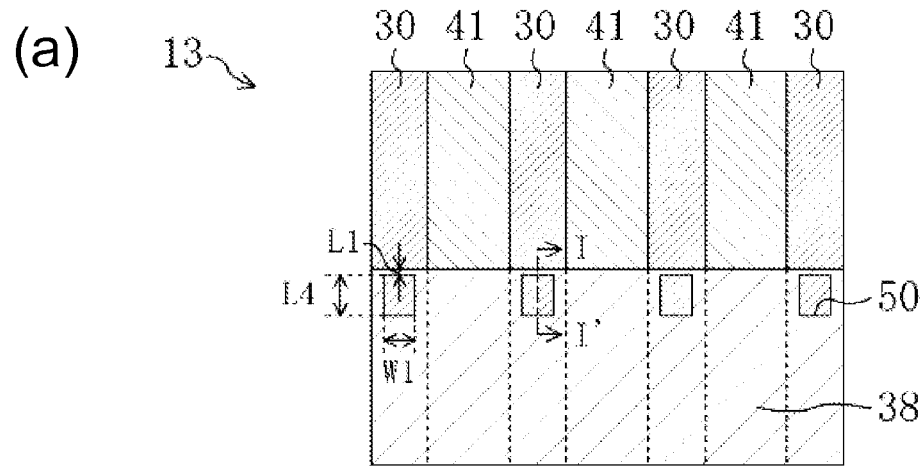
FIG. 3 are plan views of thin film transistor substrates having rectangular openings.
Figure 3:
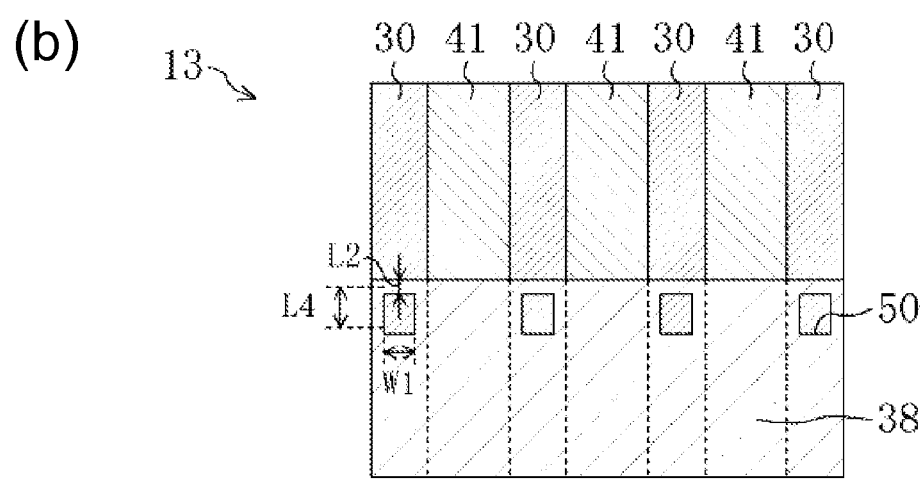
Figure 3:
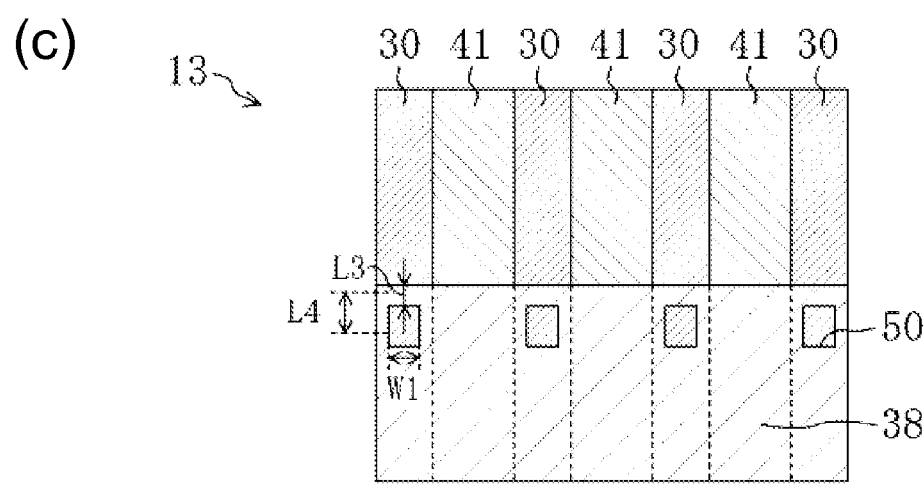
Figure 4:
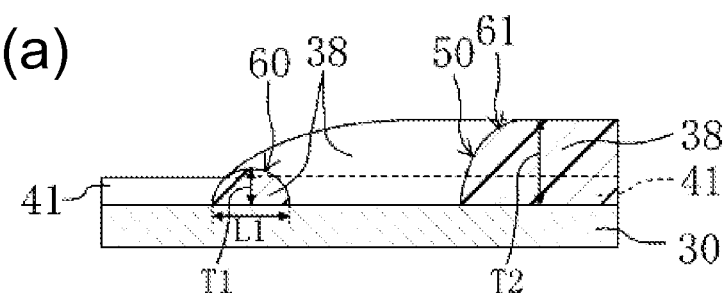
FIG. 4 are cross-sectional views of a connection terminal region of the thin film transistor substrate in respective manufacturing steps.
Figure 4:
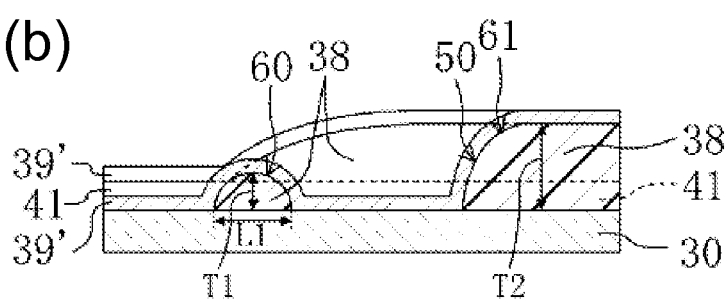
Figure 4:
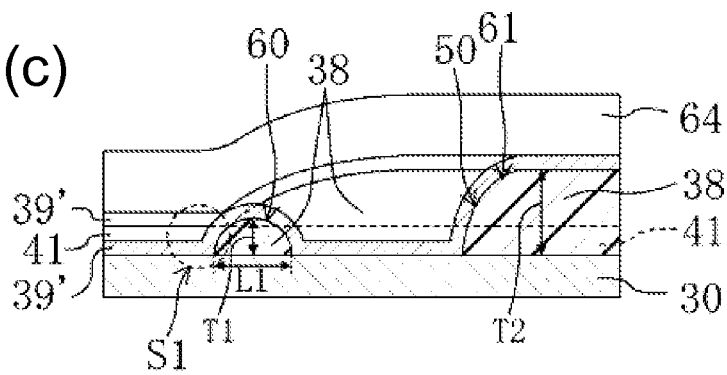
Figure 4:
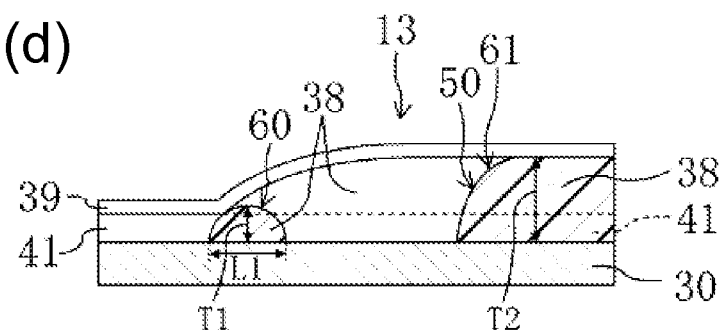

FIG. 3 (a) is a plan view of the connection terminal 41 area of thin film transistor substrate 13. FIG. 4 (d) is a cross-sectional view taken along the line I-I' of FIG. 3 (a). As shown in FIG. 3 (a) and FIG. 4 (d), the connection terminal 41 area of thin film transistor substrate 13 has glass substrate 30 and a plurality of connection terminals 41 formed on the glass substrate 30, which are disposed in parallel with each other at an equal interval. Formed on the connection terminal 41 is interlayer insulating film 38, which is also formed on thin film transistor 40. The edge of interlayer insulating film 38 is so formed that tips of a plurality of connection terminals 41 are exposed. Pixel electrode 39, which is formed on interlayer insulating film 38, extends over the exposed tip of the connection terminal 41. In this embodiment, connection terminal 41 is an extension from the source line at the edge of thin film transistor substrate 13. Connection terminal 41, however, does not have to be an extension from the source line; it may be a terminal for the wiring drawn from the gate line.

Interlayer insulating film 38 has openings 50, which respectively communicate with the glass substrate 30, along the edge of the interlayer insulating film 38, in the areas corresponding to the spaces between the plurality of connection terminals 41. The openings 50 are rectangular. As shown in FIG. 3(a), the distance between the edge of the opening 50 and the edge of the interlayer insulating film 38 may be short (that is, the distance between the front edge of the opening 50 and the edge of the interlayer insulating film 38 is L1). As shown in FIG. 3(b) and FIG. 3(c), the distance between the edge of the opening 50 and the edge of the interlayer insulating film 38 may be longer (that is, the distance between the edge of the opening 50 and the edge of the interlayer insulating film 38 is L2 or L3, which are longer than L1). An appropriate distance between the front edge of the opening 50 and the edge of the interlayer insulating film 38 can be selected from these distances. The opening 50 may be disposed at an appropriate location to effectuate the present invention based on factors including the thickness of each of a plurality of films making up the thin film transistor substrate 13. Specifically, distances L1, L2 and L3, between the front edge of opening 50 and the edge of interlayer insulating film are set to 10 μm or less, preferably to 3 to 7.2 μm, and more preferably, 3 to 6 μm.

Furthermore, as shown in FIG. 5(a) through FIG. 5(c), the vertical dimension of the opening 50, which is parallel to the extending direction of the plurality of connection terminals 41, may be set at a predetermined value (L4). The horizontal dimension of the opening 50, which is perpendicular to the extending direction of the plurality of connection terminals 41, may be longer (that is, the horizontal dimension is W1 in FIG. 5(a)) or shorter (that is, the horizontal dimension is W2 in FIG. 5(b) or W3 in FIG. 5(c)). An appropriate horizontal dimension can be selected from these horizontal dimensions to effectuate the present invention based on factors including the thickness of each of a plurality of films making up the thin film transistor substrate 13. Specifically, the vertical dimension L4, which is parallel to the extending direction of the plurality of connection terminals 41, is 20 μm, and the horizontal dimensions W1, W2 and W3, which are perpendicular to the extending direction of the plurality of connection terminals 41, are 9.5 to 13.5 μm.

Figure 6:
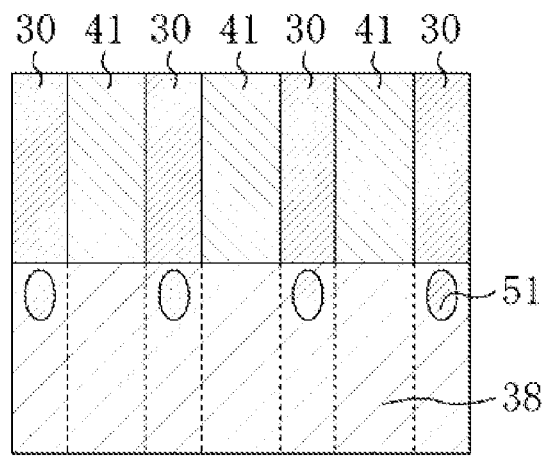
FIG. 6 is a plan view of a thin film transistor substrate having oval openings.
Figure 7:
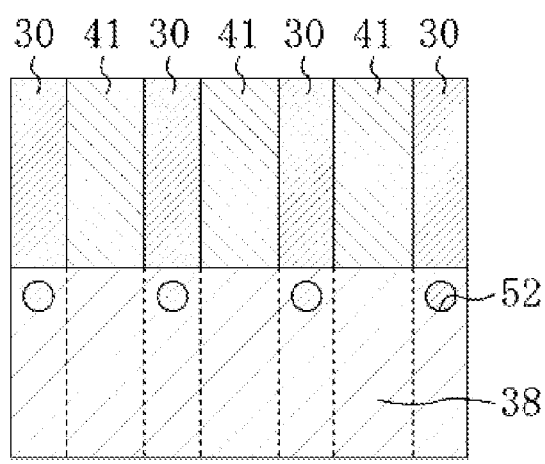
FIG. 7 is a plan view of a thin film transistor substrate having circular openings.
Figure 8:
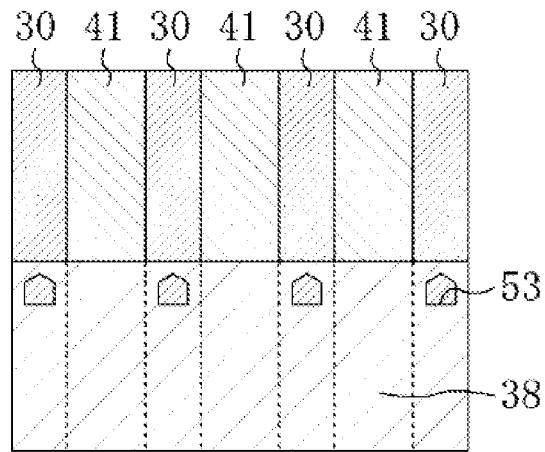
FIG. 8 is a plan view of a thin film transistor substrate having pentagonal openings.
Figure 9:
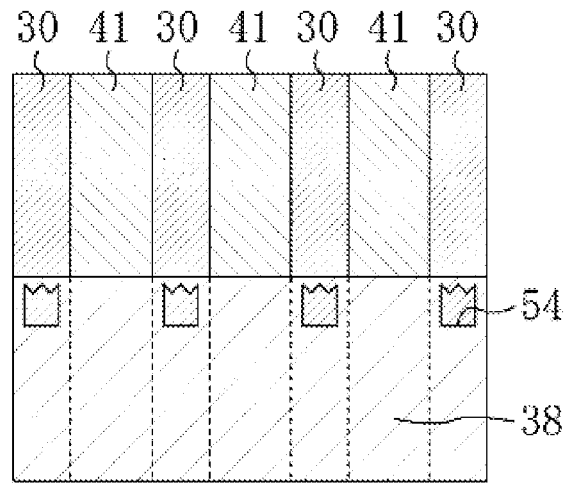
FIG. 9 is a plan view of a thin film transistor substrate having openings with a toothed side close to the edge.
Figure 10:
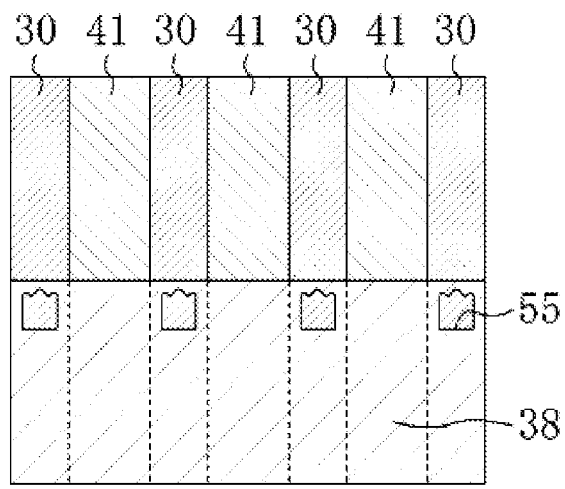
FIG. 10 is a plan view of the thin film transistor substrate having openings with a rippled side close to the edge.
Figure 11:
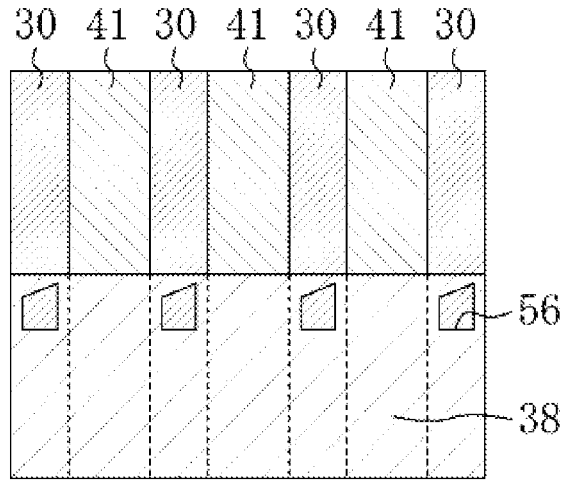
FIG. 11 is a plan view of the thin film transistor substrate having trapezoidal openings with a sloped side close to the edge.

The opening 50 need not be rectangular, and may be, for example, shapes shown in FIG. 6 through FIG. 11. FIG. 6 shows a thin film transistor substrate having oval openings 51. FIG. 7 shows a thin film transistor substrate having circular openings 52. FIG. 8 shows a thin film transistor substrate having pentagonal openings 53 having an apical angle pointing to the edge. The openings 50 may be formed in any polygon other than rectangle or pentagon. FIG. 9 shows a thin film transistor substrate having openings 54, each of the openings 54 having a toothed side close to the edge. FIG. 10 shows a thin film transistor substrate having openings 55, each of the openings 55 having a rippled side close to the edge. FIG. 11 shows a thin film transistor substrate having trapezoidal openings 56 having a sloped side close to the edge.

Figure 12:
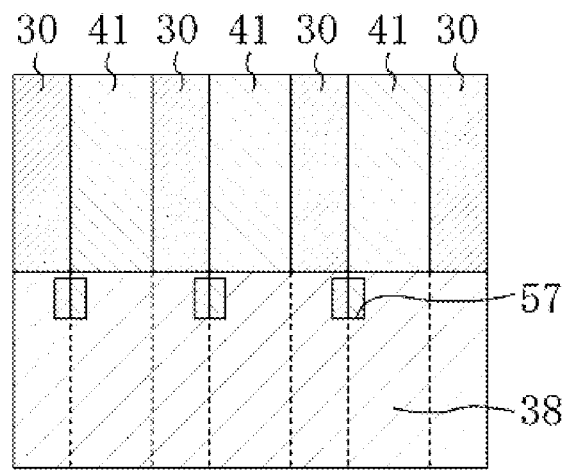
FIG. 12 is a plan view of a thin film transistor substrate having openings disposed in such a way as to extend over one of the adjacent connection terminals.
Figure 13:
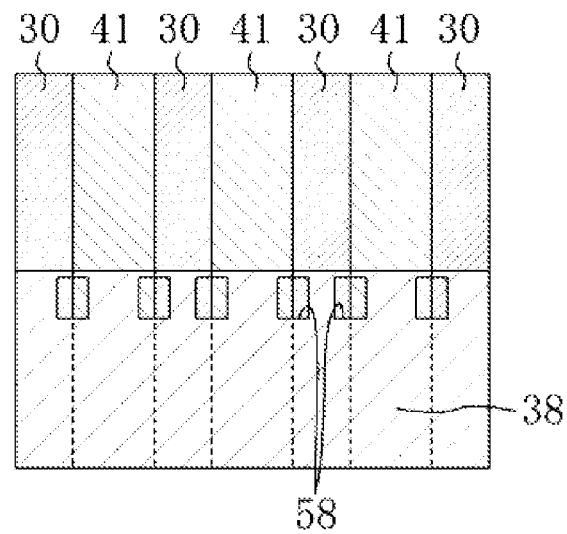
FIG. 13 is a plan view of the thin film transistor substrate having openings disposed in pairs side by side, with each opening extending over the adjacent connection terminal, and arranged across the array of connection terminals.

Furthermore, as FIG. 12 and FIG. 13 show, the opening 50 may extend over the adjacent connection terminal 41. FIG. 12 shows openings 57 extending over one of the adjacent connection terminals 41. FIG. 13 shows openings 58 disposed in pairs side by side along the direction from one of the adjacent connection terminals 41 to the other connection terminal 41, each of which extends over the connection terminal 41.

The openings 50 may take other shapes. However, the openings 50 shall not connect the adjacent connection terminals 41, and a wall of the interlayer insulating film 38 must always be present between the connection terminals 41. If the opening 50 connects the adjacent connection terminals 41, the adjacent connection terminals 41 would not be insulated from each other and could have a conductive area.

The connection terminal 41 area has a cross-sectional structure as shown in FIG. 4(d). FIG. 4(d) shows a cross-section of the interlayer insulating film 38, in which the opening 50 is proximal to the viewer, and the adjacent connection terminals 41 and the pixel electrode 39 patterned atop the connection terminals 41 are distal to the viewer. The edge of the interlayer insulating film 38, adjacent to the connection terminal 41, has a small hump 60 between the front edge of the opening 50 and the edge of the interlayer insulating film 38, and a hump 61 which rises from the back edge of the opening 50 toward the pixel region. The thickness T1 of the small hump 60, disposed between the front edge the opening 50 and the edge of the interlayer insulating film 38, is smaller than thickness T2 of the hump 61, rising from the back edge of the opening 50 toward the pixel region. T1 is, for example, about a half of T2. More specifically, the thickness T1 of the small hump 60 between the front edge of the opening 50 and the edge of the interlayer insulating film 38 is, for example, approximately 1.5 μm, and the thickness T2 of the hump 61 rising from the back edge of the opening 50 toward the pixel region is, for example, approximately 2.5 to 3.0 μm.

(Manufacturing Method of Liquid Crystal Display Device 10)

Liquid crystal display device 10 according to an embodiment of the present invention is described below. The manufacturing method described below is an example only. Liquid crystal display device 10 of the present invention shall not be limited to those manufactured by the method described below.

First, glass substrate 30, which is the base of thin film transistor substrate 13, is prepared. On the glass substrate 30, a metal film of, for example, Al alloy, having a thickness of approximately 0.5 μm is deposited by sputtering.

Next, a resist mask is formed on the metal film by exposure through a photomask and development. Gate lines, gate electrodes 31 and other elements are then formed by dry etching.

Next, SiN having a thickness of approximately 0.6 μm, for example, is deposited over the entire substrate by plasma CVD for forming gate insulating film 32. Next, a Si layer having a thickness of approximately 30 nm is deposited over the entire substrate by high-density plasma CVD for forming semiconductor film 33. A protective film material layer (e.g., SiN) having a thickness of approximately 150 nm is then formed over the entire substrate by plasma CVD for forming channel protective film 34.

Next, a resist for preserving the protective film material layer over the area corresponding to the channel region of semiconductor film 33 is patterned. Using the resist as a mask, etching and resist removal processes are performed to pattern the protective film material layer, forming channel protective film 34.

Next, an n$^+$ semiconductor film 35 (e.g., n$^+$ amorphous Si) and a metal film such as Ti are sequentially deposited to form an ohmic contact layer.

A photoresist is formed over the entire substrate, exposed to light through a mask, and subjected to developing process for resist patterning. The resist is used as an etching mask. For example, plasma dry etching is performed to form the source lines, connection terminals 41 drawn from the source lines to the substrate edge, source electrode 36, drain electrode 37, n$^+$ semiconductor film 35, and semiconductor film 33.

Next, an interlayer insulating material (such as SiN) is applied over the entire surface of the substrate by plasma CVD to form a film having a thickness of approximately 0.2 μm.

Figure 14:
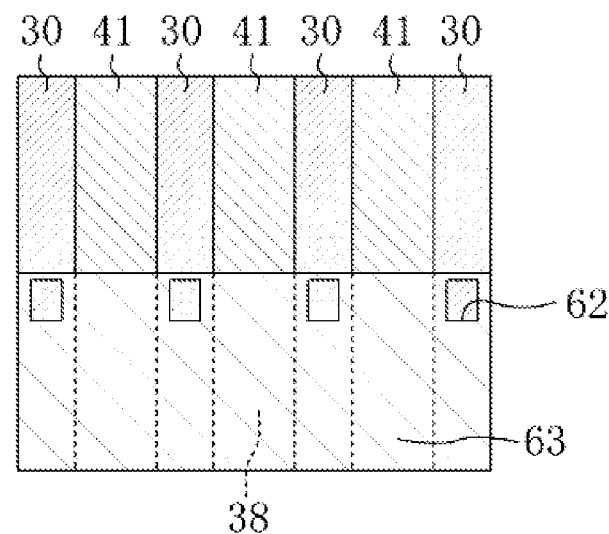
FIG. 14 is a plan view of the thin film transistor substrate and a photomask having a plurality of rectangular openings arranged in parallel with a constant spacing in between along the edge of the photomask.

Next, as shown in FIG. 14, the interlayer insulating material is exposed through a photomask 63 having multiple rectangular openings 62 disposed in parallel at equal intervals, followed by development to form an interlayer insulating film 38 that has contact holes leading to thin film transistors 40 and an edge along which tips of the plurality of connection terminal 41 are exposed. The above-mentioned rectangular openings 50 corresponding to openings 62 of photomask 63 are formed in the interlayer insulating film 38 in regions corresponding to spaces between the plurality of connection terminals 41 at an end portion of the interlayer insulating film 38. FIG. 4(a) is a cross-sectional view of the interlayer insulating film 38 in the connection terminal 41 area at this point. As shown in FIG. 4(a), because of a short distance L1 from the front edge of the opening 50 to the edge of the interlayer insulating film 38, the small hump 60 (having a thickness T1 of, for example, about 1.5 μm) of the interlayer insulating film 38 is formed, depending on the intensity distribution of the incident light during exposure. Also, the hump 61 (having a thickness T2 of, for example, about 2.5 to 3.0 μm) is formed, rising from the back edge of the opening 50 toward the pixel region.

Next, as shown in FIG. 4(b), pixel electrode material ITO 39' is applied over the entire substrate by sputtering to form an approximately 0.1 μm thick film.

A photosensitive resist 64 is then formed over the entire substrate. Since the edge of the interlayer insulating film 38 includes the small hump 60, located between the front edge of the opening 50 and the edge of the interlayer insulating film 38, and the hump 61, which rises from the back edge of the opening 50 toward the pixel region, the photosensitive resist 64 disposed over this area forms a gentle slope. Therefore, the extra thickness of photosensitive resist 64 in the vicinity of the edge of interlayer insulating film 38 is minimized.

Next, the photosensitive resist 64 is subjected to exposure and development, by which, as shown in FIG. 4(c), a pattern of photosensitive resist 64 is formed over the region where the ITO 39' is to be preserved. As described above, since the extra thickness of the photosensitive resist 64 in the vicinity of the edge of interlayer insulating film 38 is minimized, as shown in FIG. 4(c), no residue of the photosensitive resist 64 remains near the front edge (S1) of the small hump 60 between the front edge of the opening 50 and the edge of the interlayer insulating film 38.

Next, using the patterned photosensitive resist 64 as a mask, the ITO 39' is etched to form pixel electrode 39. As described above, since there is no residue of the photosensitive resist 64 on the ITO 39', which is the material for the pixel electrode, pixel electrode 39 is patterned over each connection terminal 41 precisely, leaving no residue of pixel electrode 39 between connection terminals 41.

Next, as shown in FIG. 4(d), the photosensitive resist 64 is removed, followed by polyimide application over the entire substrate to form alignment film 17. Thin film transistor substrate 13 is then completed.

Color filter substrate 14 is manufactured in the method described below. First, a glass substrate, which is the base of color filter substrate 14, is prepared. Over a certain region of the glass substrate, a black matrix is formed using metal such as Cr or a black resin. Next, over the glass substrate, red, green and blue color filters are formed using red photosensitive resin, green photosensitive resin, and blue photosensitive resin. Next, an opposite electrode is formed by sputtering a transparent conductive film such as ITO over the entire top surface of the glass substrate. Then, polyimide is applied over the opposite electrode to form an alignment film 27. Color filter substrate 14 is then completed.

Thin film transistor substrate 13 and color filter substrate 14, which are manufactured as described above, are bonded together, face to face, with spacers (not shown) in between by the sealing member 29. Liquid crystal display panel 11 is completed when liquid crystal is sealed in between the two substrates.

Next, polarizers 18 and 28 are installed on the respective sides of liquid crystal panel 11 in the direction of the panel thickness, followed by the installation of drive circuits and backlight 12. This completes liquid crystal display device 10.

Figure 15:
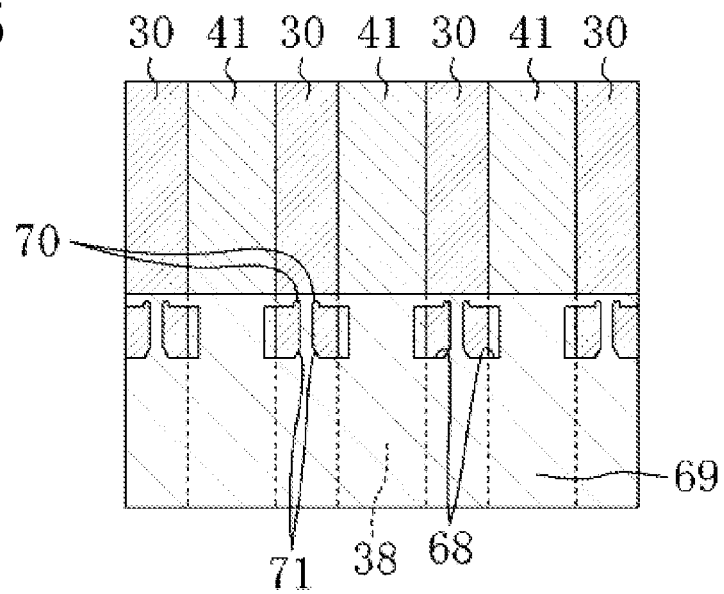
FIG. 15 is a plan view of a thin film transistor substrate and a photomask having a plurality of approximately rectangular openings arranged in parallel in pairs side by side.

In the description of the manufacturing method of the liquid crystal display device 10 according to this embodiment, the interlayer insulating film 38, as shown in FIG. 3(a), is used as an example. For this reason, in the description, the material for interlayer insulating film 38 underwent exposure and development using the photomask 63 having a plurality of rectangular openings 62 along the edge, arranged in parallel with a constant spacing in between, as shown in FIG. 14. In practice, however, other appropriate photomask can be selected for other types of the openings. The shapes of the openings in the photomask must be approximately the same as the shape of the openings to be formed in the interlayer insulating film 38. Also, if the openings 58 as shown in FIG. 13, for example, is to be formed in the interlayer insulating film 38, which openings are arranged in parallel in pairs side by side in the direction from one of the adjacent connection terminals 41 to the other connection terminal 41 with each opening extending over the connection terminal 41, then a photomask 69, having openings 68 shown in FIG. 15, may be used. In the photomask 69 shown in FIG. 15, a plurality of approximately rectangular openings 68 are disposed in pairs, side by side, which are aligned to the openings 58 in the interlayer insulating film 38 shown in FIG. 13. The pairs of openings 68, which are arranged side by side, have protrusions 70 disposed at opposed corners, close to the mask edge. By forming the protrusions 70 this way, during exposure and development, humps in regions corresponding to the protrusions 70 of the openings 58 formed in the interlayer insulating film 38 shown in FIG. 13 can effectively be suppressed, and a desired rectangular shape can be formed. Furthermore, for openings 68 which are paired and arranged side by side, cut-off corner 71 is formed on each of the openings 68, opposite the protrusion 70, to provide a partially wider spacing between the paring openings 68. This partially widened spacing between the pair of openings 68 can successfully prevent the paring openings 68 in the interlayer insulating film 38 from being connected with each other in the process of exposure and development.

Figure 16:
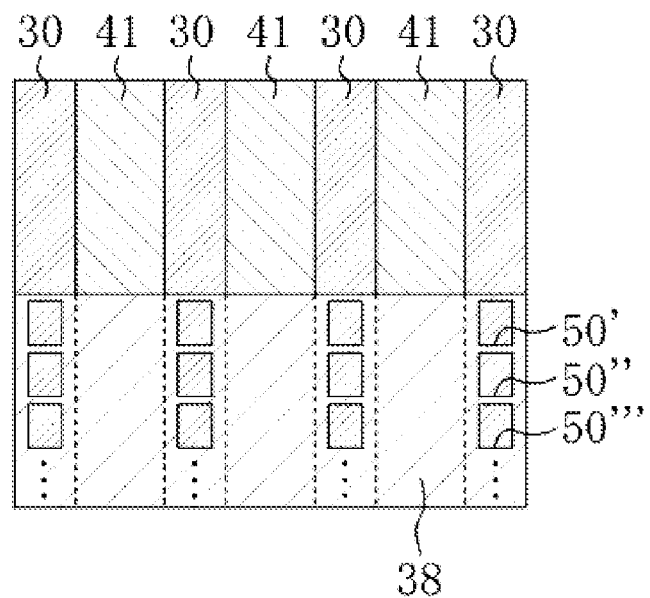
FIG. 16 is a plan view of the thin film transistor substrate having a plurality of openings disposed inwardly from the edge of the interlayer insulating film.
Figure 17:
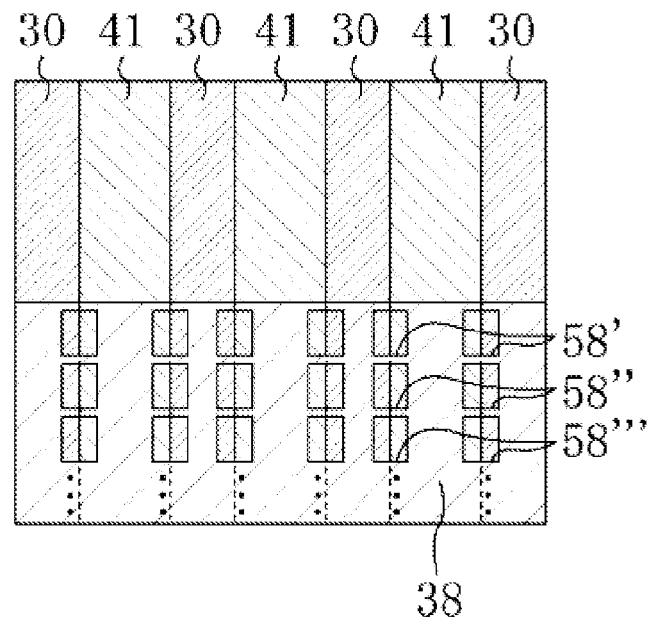
FIG. 17 is a plan view of the thin film transistor substrate having a plurality of openings disposed in pairs, inwardly from the edge of the interlayer insulating film.

Furthermore, multiple openings may be formed for openings 50 to 58 in the interlayer insulating film 38 in the extending direction of the connection terminals 41. Specifically, as shown in FIG. 16, in addition to openings 50' disposed close to the edge of the interlayer insulating film 38, openings 50", 50''', . . . may be disposed inwardly from the edge of the interlayer insulating film 38. Furthermore, as shown in FIG. 17, openings 58', disposed in pairs and arranged side by side in the direction from one of the adjacent connection terminals 41 to the other connection terminal 41, each of the openings 58' extending over the adjacent connection terminal 41 along the edge of the interlayer insulating film 38, may be followed by openings 58", 58''', . . . , which are disposed in the same manner, inwardly from the edge of the interlayer insulating film 38. With this configuration, formation of resist residues can be avoided even more effectively, because the configuration provides an extended area of the interlayer insulating film 38 with a smaller film thickness inwardly from the edge of the interlayer insulating film 38. The openings may be formed in any shape other than the rectangle.

The number of openings disposed consecutively inward from the edge of the interlayer insulating film 38, shown in FIG. 16 and FIG. 17, is not limited. However, any openings which are disposed at the innermost location must not be a single opening that spans from one connection terminal 41 to the adjacent connection terminal 41. This is because ITO residue in the openings can cause conduction between the adjacent connection terminals 41.

Figure 18:
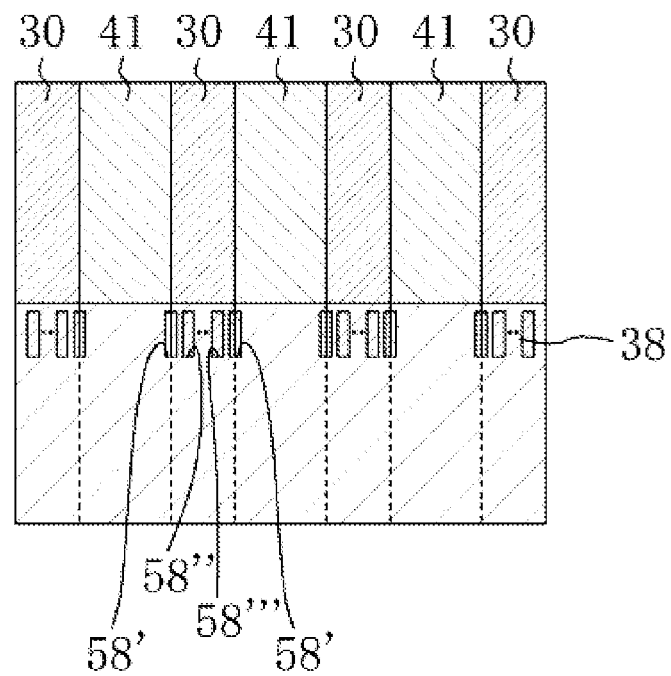
FIG. 18 is a plan view of the thin film transistor substrate having a plurality of openings disposed in the interlayer insulating film in the direction from one of the adjacent connection terminals to the other connection terminal.
Figure 19:
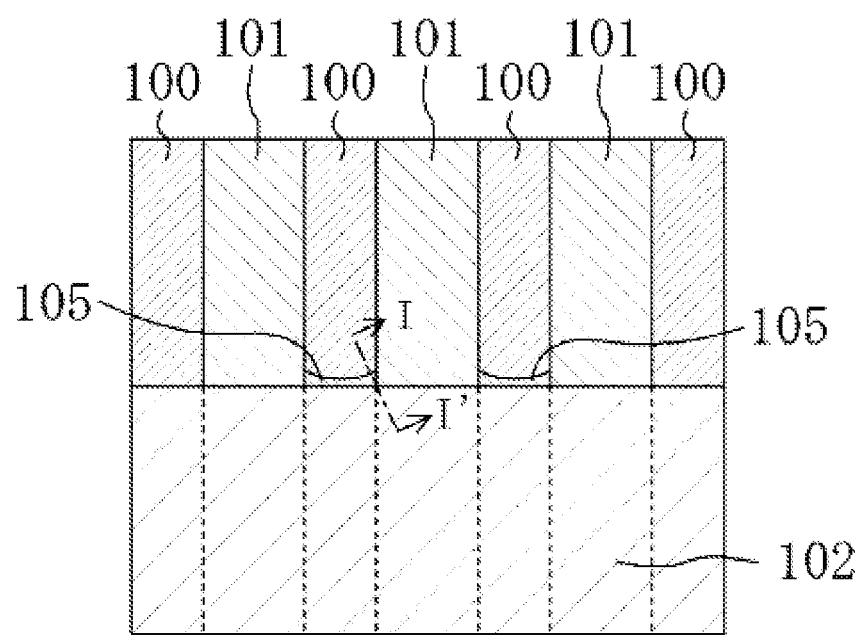
FIG. 19 is a plan view of a conventional active matrix substrate.
Figure 20:
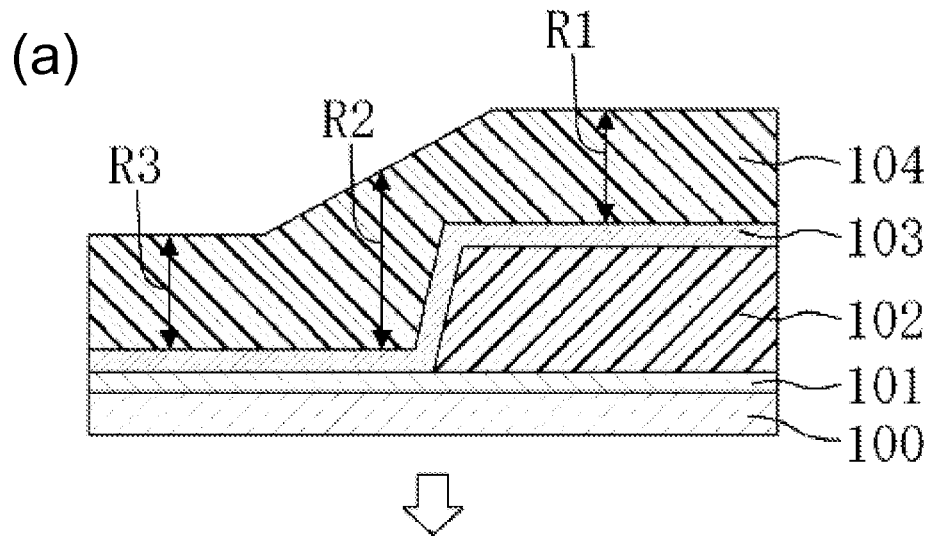
FIG. 20 are cross-sectional views of a connection terminal region of the conventional active matrix substrate in respective manufacturing steps.
Figure 20:
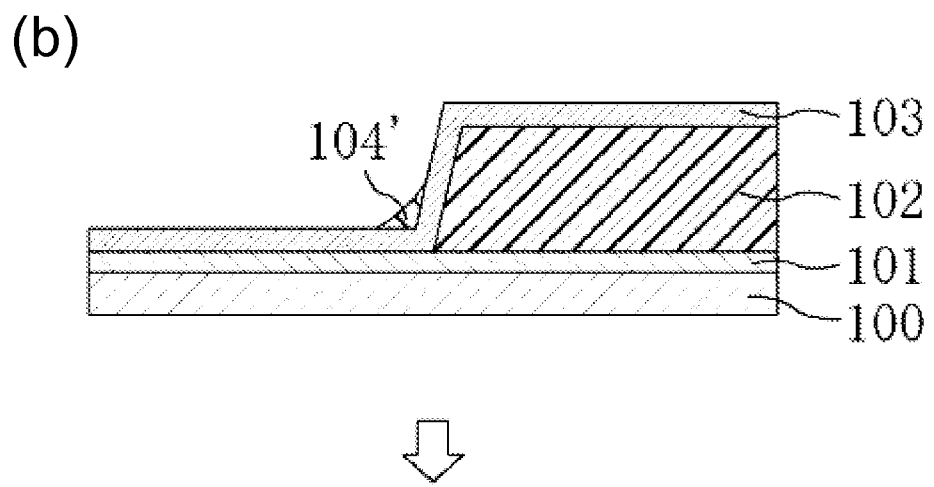
Figure 20:
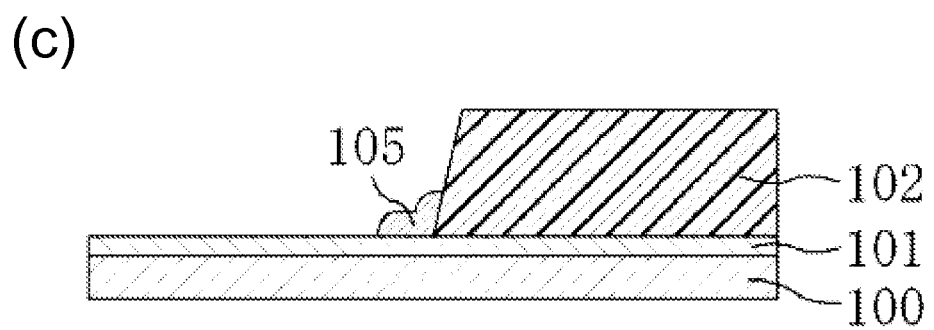

Furthermore, the openings 58 in the interlayer insulating film 38 are not limited to those disposed in pairs and arranged side by side in the direction from one of the adjacent connection terminals 41 to the other connection terminal 41 along the edge of the interlayer insulating film 38. As shown in FIG. 18, a greater number of openings 58', 58", 58''', . . . may be disposed in parallel. Furthermore, the number and shapes of the openings disposed in parallel is not limited.

Although, in these embodiments, the display device is related to an LCD (liquid crystal display), the display device is not limited to LCD-related devices. The display device may be organic EL (organic electro luminescence), inorganic EL (inorganic electro luminescence), electrophoretic, PD (plasma display), PALC (plasma addressed liquid crystal display), FED (field emission display), or SED (surface-conduction electron-emitter display).

(Operational Advantages)

Operational advantages of the embodiment of the present invention are described below. Liquid crystal display device 10 of the present invention has openings 50 in interlayer insulating film 38 along its edge in the regions corresponding to the spaces between the plurality of connection terminals 41. The edge of the interlayer insulating film 38 therefore has a small hump 60, which is located between the front edge of the opening 50 and the edge of the interlayer insulating film 38, and a hump 61, which rises from the back edge of the opening 50 toward the pixel region. As a result, the photosensitive resist 64, applied over the entire substrate for patterning the pixel electrodes 39, forms a gentle slope over the small hump 60, between the front edge of the opening 50 and the edge of the interlayer insulating film 38, and over the hump 61, which rises from the back edge of the opening 50 toward the pixel region. This minimizes the extra thickness of the photosensitive resist 64 deposited in the vicinity of the edge of the interlayer insulating film 38, thereby successfully avoiding the formation of the residue of photosensitive resist 64 near the edge of the interlayer insulating film 38 after the photosensitive resist 64 is removed. In the absence of this residue of photosensitive resist 64, no residue of pixel electrode 39 is left behind. This way, leakage current between adjacent connection terminals 41 is successfully prevented.

The shapes of the openings which may be formed in the interlayer insulating film 38 are shown in FIG. 3 and FIG. 5 through FIG. 13. Any of these openings provide at least the operational advantage described above.

Embodiments

On the thin film transistor substrate having the structure as described before, evaluation tests were conducted as follows to examine the relationship between the presence or absence of the photosensitive resist residue and the locations and sizes of the openings in the interlayer insulating film.

Embodiments

Figure 5:
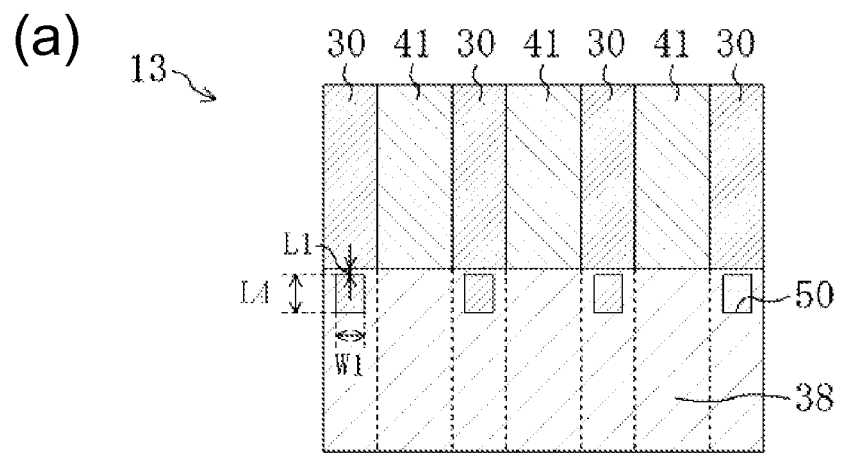
FIG. 5 are plan views of a thin film transistor substrate having rectangular openings, according to respective embodiments.
Figure 5:
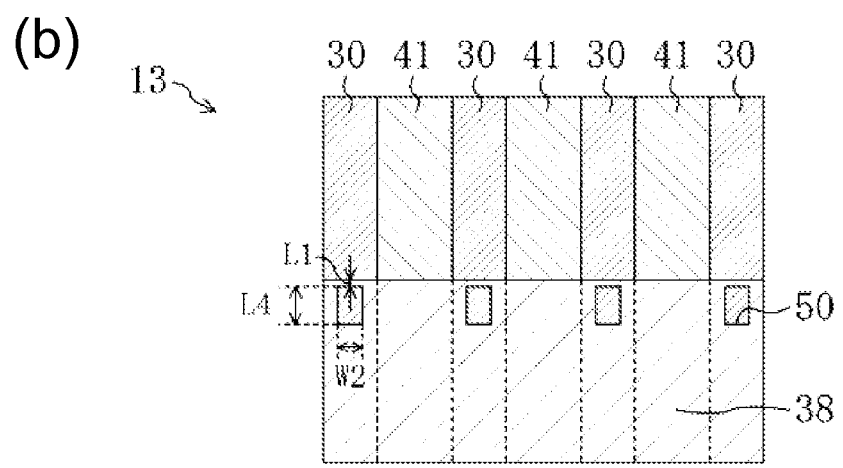
Figure 5:
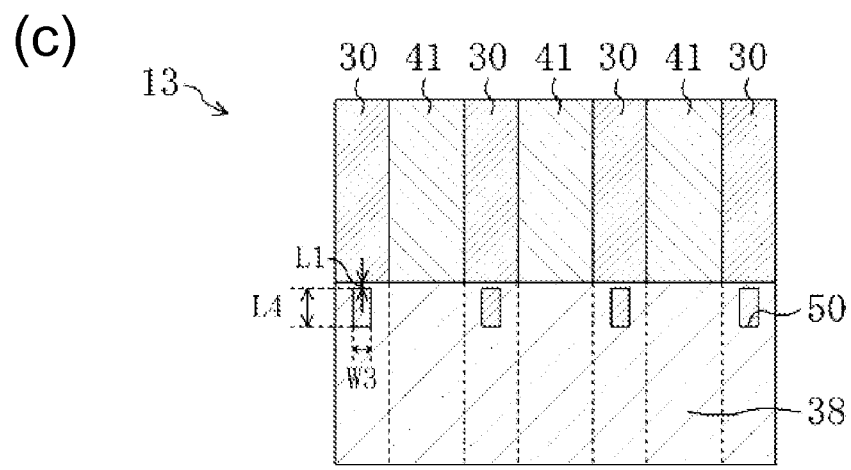

As Embodiment 1, an interlayer insulating film, similar to those shown in FIG. 3 and FIG. 5 according to the embodiment, was formed. The rectangular openings in the interlayer insulating film had a vertical dimension (L4) of 19.5 μm, which is parallel to the extending direction of the plurality of connection terminals, and a horizontal dimension (W1) of 13.5 μm. The distance (L1) between the front edge of the opening and the edge of the interlayer insulating film was 3.0 μm.

Interlayer insulating films were formed to have the same L4 and W1 as Embodiment 1 and to have an L1 of 3.5 μm, 6.0 μm, and 7.2 μm, respectively. These are Embodiments 2, 3 and 4.

Next, an interlayer insulating film was formed to have the same L1 and L4 as Embodiment 1 and to have a W1 of 9.5 μm. This is Embodiment 5. Also, interlayer insulating films were formed to have the same L4 and W1 as Embodiment 5 and to have an L1 of 3.5 μm, 6.0 μm, and 7.2 μm, respectively. These are Embodiments 6, 7 and 8.

Next, an interlayer insulating film was formed to have the same L1 and L4 as Embodiment 1 and to have a W1 of 6.5 μm. This is Embodiment 9. Also, interlayer insulating films were formed to have the same L4 and W1 as Embodiment 9 and to have an L1 of 3.5 μm, 6.0 μm, and 7.2 μm, respectively. These are Embodiments 10, 11 and 12.

Next, as Embodiment 13, an interlayer insulating film was formed, as shown in FIG. 13 according to the embodiment, with rectangular openings disposed in pairs, side by side, in the direction from one of the adjacent connection terminals to the other connection terminal with each opening extending over the neighboring connection terminal. The interlayer insulating film in Embodiment 13 had openings, each of the openings having a vertical dimension (L4) of 19.5 μm, which is parallel to the extending direction of the plurality of connection terminals, and a horizontal dimension (W1) of 10.5 μm, with the distance (L1) between the front edge of the opening and the edge of the interlayer insulating film of 3.0 μm. The adjacent openings were 5.5 μm apart.

Also, interlayer insulating films were formed to have the same L4 and W1 as Embodiment 13 and to have an L1 of 3.5 μm, 6.0 μm, and 7.2 μm, respectively. These are Embodiments 14, 15 and 16.

Next, for Embodiments 1 through 16, ITO as the pixel electrode material was deposited over the entire substrate by sputtering to form a 0.1 μm thick film. Then, a photosensitive resist was applied over the entire substrate.

Next, the photosensitive resist was subjected to exposure and development, by which a pattern of the photosensitive resist was formed over the region where ITO is to be preserved. For the exposure treatment, three different exposure amounts were used (45, 50 or 60 mJ/cm$^2$).

In the Embodiments described above, the connection terminals had a layered structure of Ti film (350 Å), Al film (3600 Å) and Ti film (1000 Å). The connection terminals, each being 50 μm wide, were disposed at an interval of 22 μm. The interlayer insulating film disposed over the entire substrate had a thickness of 3.3 μm.

Embodiments 1 through 16, which were prepared as described above, were examined for any photosensitive resist residue.

Comparison Example

As a comparison example, a substrate having the same structure as the Embodiments, except that it was not subjected to the formation of openings in the interlayer insulating film, was prepared. Presence or absence of photosensitive resist residue was investigated by microscopic examination in the same manner.

(Test Results)
Table 1 shows the test results of the Embodiments and the comparison example.

TABLE 1

| | | | | (Exposure Amount) | | |
| --- | --- | --- | --- | --- | --- | --- |
| | L1 | L4 | W1 | 45 mJ/cm$^2$ | 50 mJ/cm$^2$ | 60 mJ/cm$^2$ |
| Embodiment 1 | 3.0 μm | 19.5 μm | 13.5 μm | ◯ | ◯ | ◯ |
| Embodiment 2 | 3.5 μm | | | ◯ | ◯ | ◯ |
| Embodiment 3 | 6.0 μm | | | ◯ | ◯ | ◯ |
| Embodiment 4 | 7.2 μm | | | Δ | ◯ | ◯ |
| Embodiment 5 | 3.0 μm | 19.5 μm | 9.5 μm | Δ | ◯ | ◯ |
| Embodiment 6 | 3.5 μm | | | Δ | ◯ | ◯ |
| Embodiment 7 | 6.0 μm | | | Δ | ◯ | ◯ |
| Embodiment 8 | 7.2 μm | | | X | Δ | ◯ |
| Embodiment 9 | 3.0 μm | 19.5 μm | 6.5 μm | X | Δ | ◯ |
| Embodiment 10 | 3.5 μm | | | X | Δ | ◯ |
| Embodiment 11 | 6.0 μm | | | X | Δ | ◯ |
| Embodiment 12 | 7.2 μm | | | X | Δ | ◯ |
| Embodiment 13 | 3.0 μm | 19.5 μm | 10.5 μm | ◯ | ◯ | ◯ |
| Embodiment 14 | 3.5 μm | | | ◯ | ◯ | ◯ |
| Embodiment 15 | 6.0 μm | | | ◯ | ◯ | ◯ |
| Embodiment 16 | 7.2 μm | | | Δ | ◯ | ◯ |
| Comparison Example | | | | X | X | ◯ |

◯: No resist residue present
Δ: Resist residues existed in the corners around connection terminals
X: Resist residues existed and spanned the adjacent connection terminals As shown in Table 1, in the comparison example in which openings were not formed in the interlayer insulating film, resist residues remained and spanned the adjacent connection terminals when the exposure amount was 45 mJ/cm$^2$ or 50 mJ/cm$^2$, while such residues were not generated in Embodiments 1 through 7 and Embodiments 13 through 16.

While L1 values of less than 3.0 μm are not included in the Embodiments and Table 1, substrates having L1 of less than 3.0 μm (specific numerical values were not measurable) were actually manufactured and tested, which provided similar effects.

INDUSTRIAL APPLICABILITY

As described above, the present invention is useful for a display device and for a method for manufacturing the same.

DESCRIPTION OF REFERENCE NUMERALS

10 Liquid crystal display device
13 Thin film transistor substrate (active matrix substrate)
14 Color filter substrate
30 Glass substrate
38 Interlayer insulating film
39 Pixel electrode
40 Thin film transistor
41 Connection terminal
50, 51, 52, 53, 54, 55, 56, 57, 58 Openings
62, 68 Openings in photomask
63, 69 Photomask
64 Photosensitive resist

The invention claimed is:
1. A display device comprising an active matrix substrate having a plurality of switching elements arranged in a matrix and an opposite substrate located opposite to said active matrix substrate through a display medium layer, wherein said active matrix substrate comprises:

a plurality of connection terminals for sending drive signals to the switching elements, wherein the connection terminals are respectively electronically connected to, and led out from, the switching elements and are arranged in parallel with each other in a plan view;

an interlayer insulating film disposed over the plurality of switching elements and over the plurality of connection terminals, wherein tips of the plurality of connection terminals are exposed along a horizontal end portion of the interlayer insulating film in the plan view; and a layer made of a pixel electrode material disposed on said interlayer insulating film and on the exposed tips of the plurality of connection terminals, the layer made of the pixel electrode material including a plurality of pixel electrodes, each of which is electrically connected to a corresponding switching element through a contact hole formed in said interlayer insulating film, wherein an opening is formed in said interlayer insulating film in a region between adjacent connection terminals at the horizontal end portion of said interlayer insulating film in the plan view, and a height of the interlayer insulating film between a horizontal end edge of the interlayer insulating film and a front edge of the opening that is adjacent to said horizontal end edge of the interlayer insulating film is lower than a height of the interlayer insulating film formed on an opposite side of the opening.

2. The display device according to claim 1, wherein said opening is rectangular.

3. The display device according to claim 2, wherein a distance from the front edge of said opening to the horizontal end edge of said interlayer insulating film is 10 μm or less and greater than zero.

4. The display device according to claim 2, wherein said opening has a dimension of 9.5 μm to 13.5 μm or greater in the direction perpendicular to the extending direction of the plurality of connection terminals.

5. The display device according to claim 1, wherein said opening extends over a connection terminal adjacent thereto.

6. The display device according to claim 1, wherein said display medium layer comprises a liquid crystal material.

7. The display device according to claim 1, wherein said pixel electrode material is indium tin oxide or indium zinc oxide.

8. The display device according to claim 1, wherein said switching element is a thin film transistor.

9. A manufacturing method for the display device having the active matrix substrate having a plurality of switching elements arranged in a matrix, and an opposite substrate that is located opposite to said active matrix substrate through a display medium layer, the method comprising the steps of:

preparing an insulating substrate for said active matrix substrate;

arranging a plurality of switching elements in matrix on the insulating substrate, and forming a plurality of connection terminals, which are arranged in parallel with each other and respectively electrically connected to, and led out from, the switching elements, for sending drive signals to the switching elements;

forming an interlayer insulating material over said insulating substrate on which said switching elements and said connection terminals are disposed;

forming an interlayer insulating film over the plurality of switching elements and over the plurality of connection terminals by subjecting said interlayer insulating material to exposure and development using a photomask having a plurality of openings along an edge of the photomask, which openings are arranged in parallel at a certain interval, wherein the interlayer insulating film has a plurality of contact holes respectively leading to the plurality of switching elements, and wherein the interlayer insulating film exposes tips of the plurality of connection terminals along a horizontal end portion of the interlayer insulating film in a plan view, and has an opening in a region between adjacent connection terminals at the horizontal portion of said interlayer insulating film in the plan view;

forming an pixel electrode material over said insulating substrate on which said interlayer insulating film has been disposed;

disposing a photosensitive resist on said pixel electrode material and subjecting the resist to exposure and development; and forming a plurality of pixel electrodes on said interlayer insulating film and a plurality of terminals on the exposed tips of the plurality of connection terminals, the plurality of pixel electrodes being electrically respectively connected to said plurality of switching elements through said plurality of contact holes, respectively, formed in said interlayer insulating film, by etching the pixel electrode material using said photosensitive resist as a mask.

* * * * *